United States Patent
Huang et al.

[11] Patent Number: 6,103,455
[45] Date of Patent: *Aug. 15, 2000

[54] METHOD TO FORM A RECESS FREE DEEP CONTACT

[75] Inventors: Kuo Ching Huang, Kaohciung; Wen-Chuan Chiang, Hsin-Chu; Cheng-Ming Wu, Tzekuan; Yu-Hua Lee, Hsinchu, all of Taiwan

[73] Assignee: Taiwan Semiconductor Manufacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/073,947

[22] Filed: May 7, 1998

[51] Int. Cl.⁷ ........................................................ G03F 7/26
[52] U.S. Cl. .......................... 430/313; 430/317; 438/618; 438/637; 438/675
[58] Field of Search ................................... 430/313, 314, 430/317; 438/618, 628, 634, 635, 637, 639, 672, 675

[56] References Cited

U.S. PATENT DOCUMENTS

| | | | |
|---|---|---|---|
| 5,173,439 | 12/1992 | Dash et al. | 437/67 |
| 5,534,462 | 7/1996 | Fiordalice et al. | 437/190 |
| 5,578,523 | 11/1996 | Fiordalice et al. | 437/190 |
| 5,633,201 | 5/1997 | Choi | 438/620 |
| 5,654,240 | 8/1997 | Lee et al. | 438/647 |
| 5,851,912 | 12/1998 | Liaw et al. | 438/621 |
| 5,869,392 | 2/1999 | Kimura | 438/620 |
| 5,882,503 | 3/1999 | Bernhardt | 206/664 |
| 5,886,410 | 3/1999 | Chiang et al. | 257/759 |
| 5,920,790 | 7/1999 | Wetzel et al. | 438/618 |

*Primary Examiner*—Kathleen Duda
*Attorney, Agent, or Firm*—George O. Saile; Stephen B. Ackerman; William J. Stoffel

[57] ABSTRACT

A method of forming a deep contact by forming a dielectric layer 20 over a semiconductor structure 10. A main point is that the hard mask 30 is removed after the plug 52 is formed. A hard mask layer 30 is formed over the dielectric layer 20. A contact photoresist layer 36 is formed over the hard mask layer 30. The hard mask layer 30 is etched through the contact photoresist opening 39 to form a contact hard mask opening 41 exposing the dielectric layer 20. The dielectric layer 20 is etched using a high density plasma etch process using the contact photoresist layer 36 and the hard mask layer 30 as an etch mask forming a contact hole 40 in the dielectric layer 20. The contact photoresist layer 36 is removed. A metal layer 50 is formed filling the contact hole 40 and covering over the hard mask layer 30. The metal layer 50 is etched back forming a plug 52 filling the contact hole 40. Now, the hard mask layer 30 is removed. The removal of the hard mask 30 after the metal layer 50 deposition: (a) prevents the contact hole 40 from being contaminated from photoresist and other contamination formed during the hard mask 30 removal steps; and (b) creates a plug 52 that does not have a recess.

15 Claims, 5 Drawing Sheets

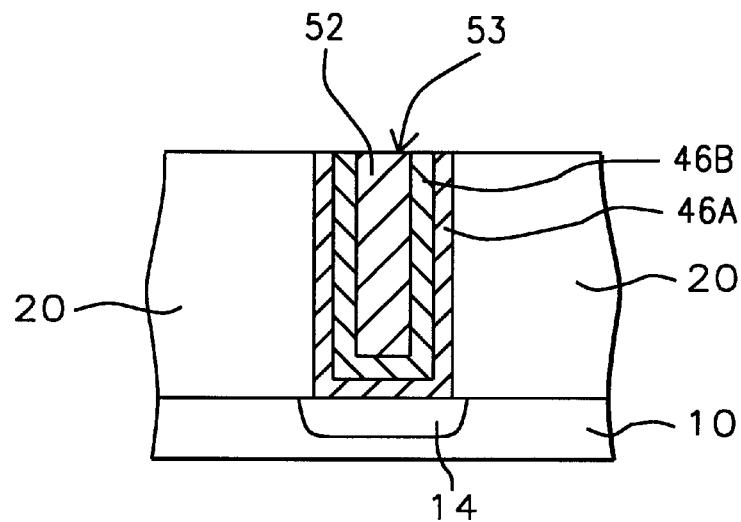
FIG. 9
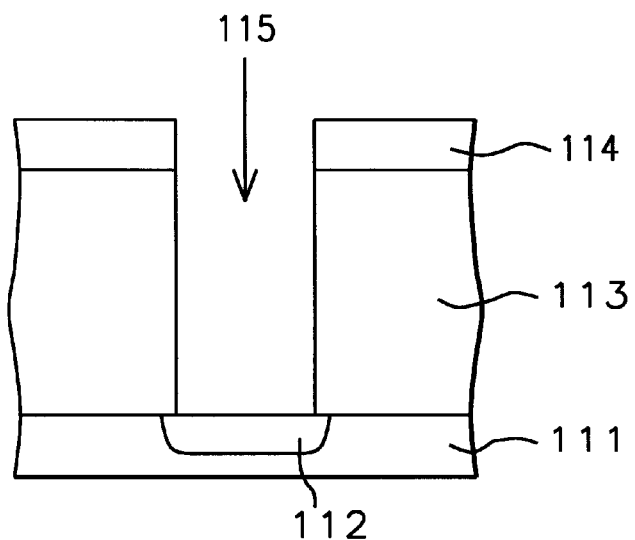
FIG. 10A - Prior Art

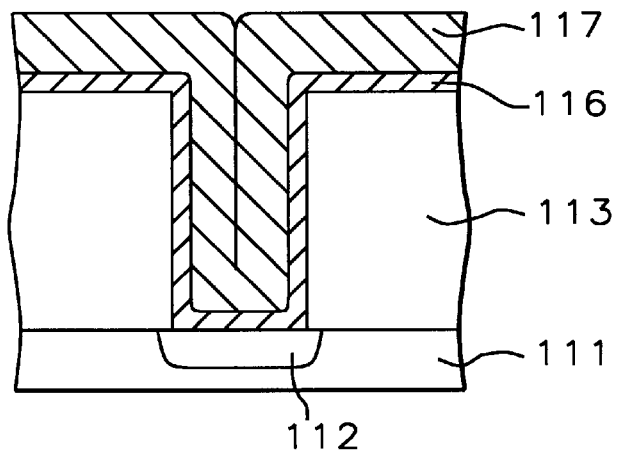
FIG. 10B – Prior Art
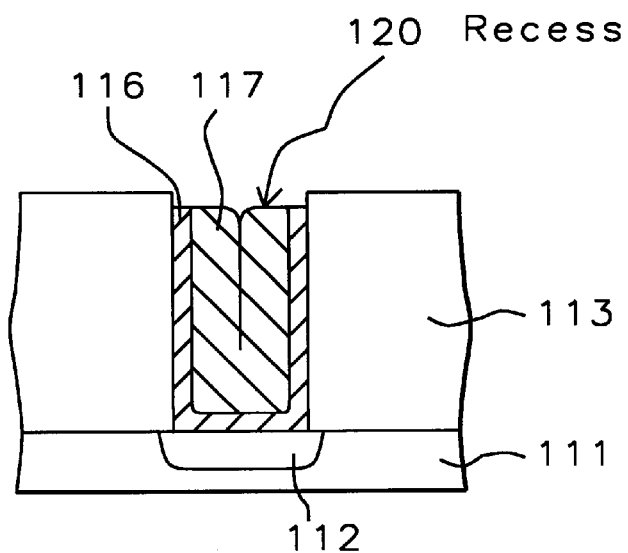
FIG. 10C – Prior Art

METHOD TO FORM A RECESS FREE DEEP CONTACT

BACKGROUND OF INVENTION

1) Field of the Invention

This invention relates generally to the fabrication of contacts for semiconductor devices and more particularly to a method of forming a deep contact hole and plug using a hard mask.

2) Description of the Prior Art

As semiconductor devices shrink, the contact holes have smaller diameters and are deeper. This increases the aspect ratio of the contact holes. Forming high aspect ratio contact holes and filling the holes with metal to form contacts creates challenges for the semiconductor industry.

To form deep contact holes with deep submicron feature size and high aspect ratio requires a high density plasma etching process. Also, to form small diameter contact holes, a thin photoresist layer is required. However, The inventors have found that the high density plasma etch's low selectivity between the photoresist and the inter-layer dielectric (ILD) makes the complete etching of contact hole difficult. This is because the thin photoresist can be etched away and the underlying insulating layer also etched. This lowers device yields. To alleviate the overetching of the thin photoresist, the inventors implemented a "hard mask" 114 etch process.

The inventors have found problems with their current method for forming contact openings using hard masks (not prior art for this patent). As shown in FIGS. 10A through 10C, a contact hole 115 is formed in an insulating layer 113 and is filled with a metal plug 117. FIG. 10A shows an insulating layer 113 formed over a substrate 10 having a doped region 112. Next, a hard mask 114 is formed over the in insulating layer 113. A contact opening 115 is etched in the hard mask 114 and insulating layer 113.

FIG. 10B shows the removal of the hard mask 114. However, the inventors have found this creates a first problem ( problem ①). The removal of the hard mask, prior to the plug 117 formation, has been found by the inventors to contaminate the contact opening 115 and lower yields. In some of the inventor's processes, a photoresist layer is formed in the contact hole 115 to protect the substrate from RIE etch damage from the RIE etch that is used to remove the hard mask 114. This photoresist layer often can't be completely removed thus leaving a "residual photoresist" in the contact hole 115. This "residual photoresist" reduces yields.

Next, FIG. 10B shows the formation of a glue layer 116 in the contact hole 115 and the substrate 10. Next a metal layer 117 is formed filling the contact hole 115.

Next, the metal layer 117 and glue layer 116 are etched back. The inventors have found that this etch back creates a second problem ( Problem ②). To remove all the metal layer and glue layer over the insulating layer, the metal layer 117 must be over etched, thus creating a recess 120 in the plug 117. The recess 120 has been found by the inventors to lower yields.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,633,201 (Choi) that teaches a method for forming tungsten (or aluminum) plugs in contact holes including depositing tungsten (or aluminum) using two selective metal deposition processes to fill two openings. U.S. Pat. No. 5,534,462 (Fiordalice) shows a conductive plug is formed in a semiconductor device by using an aluminum nitride glue layer and a hard mask. U.S. Pat. No. 5,654,240 (Lee) shows a method of fabrication for forming contacts to sources and drains. A dielectric and an overlying polysilicon conductor are formed and patterned thereby exposing a semiconductor substrate. A silicide layer is deposited, thereby contacting the polysilicon layer and the substrate. Subsequent patterning of the silicide layer using an oxide hard mask provides electrical contact between the polysilicon layer and the substrate without the risk of trenching into the substrate. However, these patents can be further improved.

SUMMARY OF THE INVENTION

It is an object of the present invention to provide a method for fabricating a deep contact hole 40 and plug 52 through an inter-level dielectric (ILD) layer 20 where the plug 52 is level with the top surface of the IDL layer 20. (i.e., the plug 52 is recess-free).

It is an object of the present invention to provide a method for fabricating a deep contact 52 through an interlevel dielectric (ILD) layer 20 using a hard mask 30 and a high density plasma (HPD) etch process.

It is an object of the present invention to provide a method for fabricating a deep contact 52 through an interlevel dielectric (ILD) layer 20 using a hard mask where the hard mask 30 remains after the W metal plug deposition 50.

It is another objective to provide a contact plug that has a top surface level with the surrounding interlevel dielectric layer (i.e., the plug 52 does not have a recess 120).

To accomplish the above objectives, the present invention provides a method of forming a contact plug 52 in a high aspect contact hole 40. A main point of the invention is that the hard mask 30 is removed after the plug 52 is formed. See FIGS. 4 & 5. This eliminates the problems 1 and 2 found by the inventors and discussed in the prior art section.

The first embodiment of the invention comprising the steps of:

a) see FIG. 1—forming a dielectric layer 20 over a semiconductor structure 10; the semiconductor structure having a doped region 14; the dielectric layer 20 having a thickness in a range of between about 8000 and 25,000 Å; the dielectric layer having a top surface;

b) forming a hard mask layer 30 over the dielectric layer 20; the hard mask layer 30 composed of polysilicon or Silicon nitride; the hard mask 30 preferably has a thickness in a range of between about 500 and 5000 Å;

c) forming a contact photoresist layer 36 having a contact photoresist opening 39 over the hard mask layer 30;

d) See FIG. 2—etching the hard mask layer 30 through the contact photoresist opening 39 to form a contact hard mask opening 41 through the hard mask layer 30 exposing the dielectric layer 20;

e) etching the dielectric layer 20 using the contact photoresist layer 36 and the hard mask layer 30 as an etch mask forming a contact hole 40 in the dielectric layer 20 exposing the semiconductor structure 10;

f) see FIG. 3—forming a metal layer 50 filling the contact hole 40 and over the hard mask layer 30; the metal layer is preferably composed of W;

A key feature is that the Hard mask 30 is not removed before the metal 50 deposition. This eliminates problems 1—Contamination of the contact hole 40.

g) SEE FIG. 4—etching back the metal layer 50 forming a plug 52 filling the contact hole 40; and the plug 52 preferably has a plug top surface; the plug top surface is above the top surface of the dielectric layer 20;

The hard mask 30 allows the metal layer 50 etch back step to leave the plug 52 thick enough to fill the contact hole 40 without creating a recess 120. This eliminates problem 2—the recess 120 in the plug. See FIG. 10C.

h) See FIG. 5—removing the hard mask layer 30.

The second embodiment of the invention forms a TiN/Ti glue layer 46 in the contact hole 40 before the W Plug 52. The second embodiment comprises the following steps:

a) See FIG. 1—forming a dielectric layer (ILD layer 20) over a semiconductor structure 10; the semiconductor structure preferably has a doped region 14; the dielectric layer preferably has a top surface;

b) forming a hard mask layer 30 over the dielectric layer 20; the hard mask layer 30 preferably composed of polysilicon or Silicon nitride;

c) forming a contact photoresist layer 36 having a contact photoresist opening 39 over the doped region 14;

d) See FIG. 2—etching the hard mask layer 30 through the contact photoresist opening 39 to form a contact hard mask opening 41 through the hard mask layer 20 exposing the dielectric layer 20;

e) etching the dielectric layer 20 using the contact photoresist layer 36 and the hard mask layer 30 as an etch mask forming a contact hole 40 in the dielectric layer 20 exposing the semiconductor structure 10;

f) See FIG. 6—removing the photoresist layer 36;

g) See FIG. 6—forming a glue layer 46 over the dielectric layer 20;

h) See FIG. 7—forming a metal layer 50 over the glue layer 46 over the dielectric layer 20 and filling the contact hole 40;

i) See FIG. 8—etching back the metal layer 50 forming a plug 50 filling the contact hole 40; the etch back stopping on the glue layer 16; and j) See FIG. 9—removing the glue layer 46 over the dielectric layer 20 and removing the hard mask layer 30.

BENEFITS OF THE INVENTION

The process of the invention provides the following benefits:

The removal of the hard mask 30 after the metal layer 50 deposition (FIGS. 3 and 5) prevent the contact hole from being contaminated from photoresist and other contamination formed during the hard mask 30 removal steps. This solves problem 1 (See prior art).

The removal of the hard mask 30 after the metal layer 50 deposition and etch back to form the plug (FIGS. 3 and 5) creates a plug 52 that does not have a recess 53. See FIG. 5—no recess in plug. Compare FIG. 10C—recess 120. This solves problem 2—Recess 120. See prior art section.

The invention's hard mask 30 prevents the excessive etching of the insulating layer 30 that occurs in prior art processes that do not have a hard mask. The hard mask prevents the HDP etch (to form the contact hole 40) from etching through the thin photoresist layer 36 and into the insulating layer 20 by the invention's hard mask 30.

Easy to remove hard mask 30 without increasing the complexity of process integration.

The window of etch back process will be enlarged because the hard mask 30 acts as a buffer layer during this process. Without the hard mask, the etch process was restricted by the thickness of photoresist 36 necessary to ensure that the insulating layer 20 was not etched.

The hard mask 30 allows the contact holes 40 to be etched more precisely and cleanly (without residual photoresist), thus reducing the contact resistance.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 2 and 6 through 9 are cross sectional views for illustrating a second embodiment for the method for forming a deep contact according to the present invention. The second embodiment has a glue layer 46.

FIGS. 10A, 10B and 10C are cross sectional views illustrating the inventor's previous process that had problems in forming a deep contact plug 117.

DETAILED DESCRIPTION OF THE PREFERRED EMBODIMENTS

The present invention will be described in detail with reference to the accompanying drawings. The present invention provides a method of forming a deep contact plug 52 through a inter-level dielectric layer 20 using a hard mask 30.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrate circuit component. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

First Embodiment of the Invention—FIGS. 1 to 5

Figure 1:
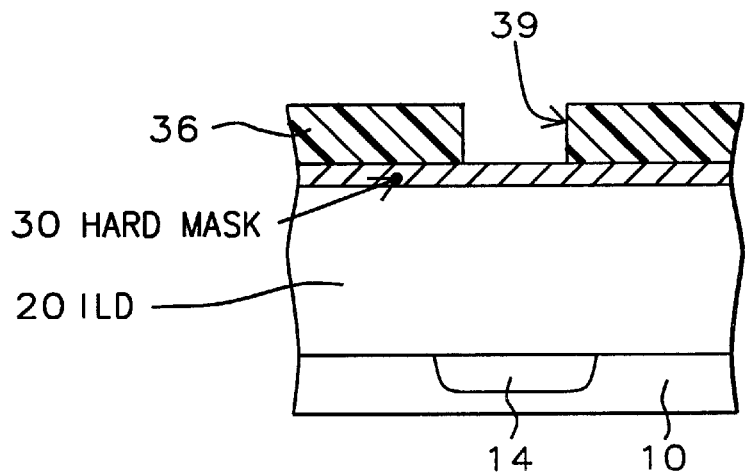
FIGS. 1 through 5 are cross sectional views for illustrating a first embodiment for the method for forming a deep contact according to the present invention.

As shown in FIG. 1, a dielectric layer (e.g., interlevel dielectric (IDL) layer) 20 is formed over a semiconductor structure 10. The semiconductor structure is preferably a semiconductor wafer (or substrate) possibly with overlying conductive and insulating layers formed thereover and the wafer preferably have doped regions (N or P) 14 therein. Semiconductor structure 10 is understood to possibly include a semiconductor wafer, active and passive devices formed within the wafer and layers formed on the wafer surface. The semiconductor structure 10 preferably has a doped region 14. The doped regions 14 can be a source/drain region or other region.

The dielectric layer 20 preferably has a thickness in a range of between about 8000 and 25,000 Å depending on the specific configuration of the chip (e.g., IDL 1, IDL 2, IDL-3—depends on the number of polysilicon layers over the substrate).

Still referring to FIG. 1, a hard mask layer 30 is formed over the dielectric layer 20. The hard mask layer 30 is preferably composed of polysilicon or Silicon nitride. The hard mask 30 preferably has a thickness in a range of between about 500 and 5000 Å.

A contact photoresist layer 36 has a contact photoresist opening 39 is formed over the hard mask layer 30. The contact photoresist opening 39 will define the hard mask contact opening 39 and the contact opening 40. The contact photoresist opening 39 preferably has a width (e.g., open dimension) in a range of between about 0.2 and 0.5 μm. The contact photoresist opening 39 preferably is formed by a photolithographic expose and develop process. The opening 39 can have any shape.

Figure 2:
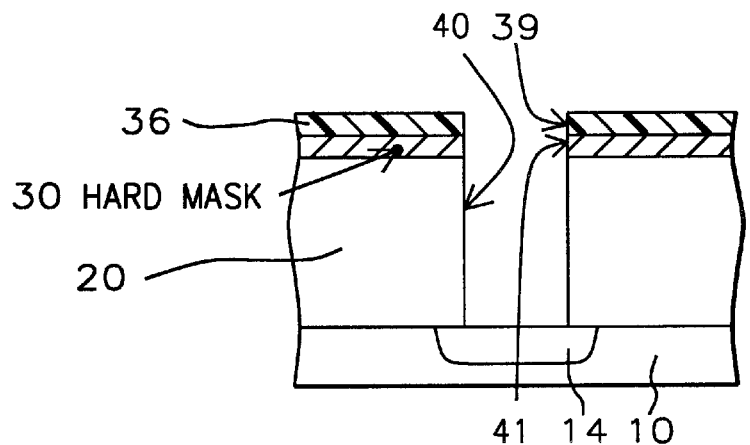

FIG. 2 shows the contact photoresist layer 36 after the photoresist hard back and/or UV curing.

As shown in FIG. 2, the hard mask layer 30 is etched through the contact photoresist opening 39 to form a contact hard mask opening 41 through the hard mask layer 20 exposing the dielectric layer 20. The etch is preferably a high density plasma (HPD) etch. Note that the photoresist is thinned by the HDP etch. Without the invention's hard mask, the dielectric layer could be etched and modifications would have to be made to the etch process or the photoresist layer thickened to prevent the excessive etching of the dielectric layer.

Referring to FIG. 2, the dielectric layer 20 is etched using the photoresist layer 36 and the hard mask layer 30 as an etch mask forming a contact hole 40 in the dielectric layer exposing the semiconductor structure 10. The dielectric layer 20 preferably etched using a High density plasma etch (HPD) process, such as a Magnetic enhanced reactive ion etch (RIE) (MERIE), electron cyclotron resonance (ECR) RIE, inductively coupled plasma (ICP) or Helicon Wafer RF plasma. The photoresist layer 6 is then removed.

A key feature is that the Hard mask 30 is not removed before the metal 50 deposition. This eliminates problems 1—Contamination of the contact hole 40.

Figure 3:
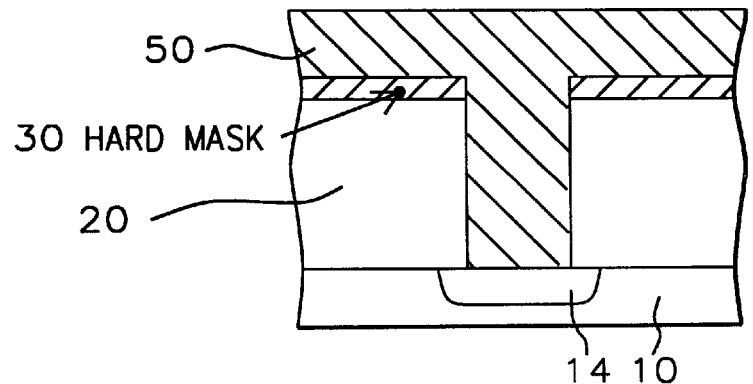
Figure 4:
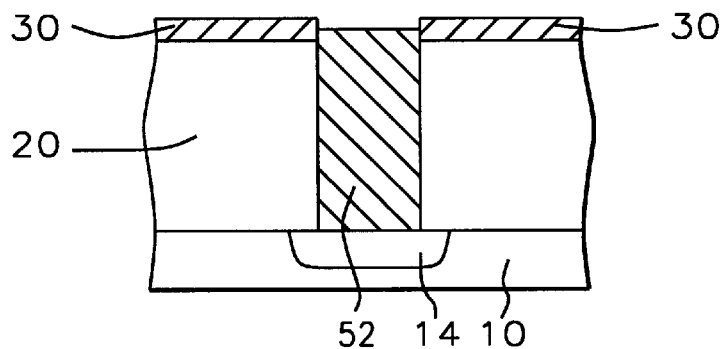
Figure 5:
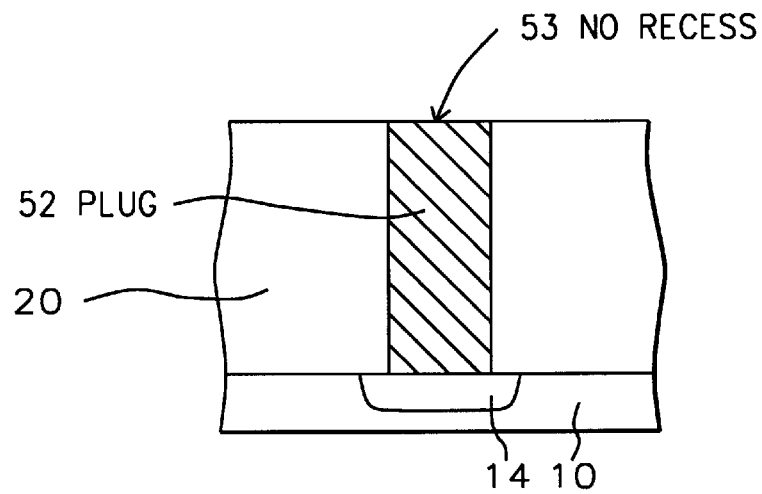

A metal layer 50 is formed filling the contact hole 40 and over the hard mask layer 30 as shown in FIG. 3. The metal layer is preferably composed of W (Tungsten). The metal layer preferably has a thickness over the dielectric layer 20 in a range of between about 10 and 4000 Å.

The tungsten metal layer 50 is preferably formed using a reduction process, such as $2WF_6+3Si \rightarrow W+3SiF_4$. The CVD Deposition process can be performed at a wafer temperature between about 400 and 500° C. with WF6, $H_2$ or $SiH_4$ gases. Preferably the etch is a two step process so that $SiH_4$ is flowed without any $WF_6$ to form a thin amorphous Si pre-nucleation layer. Then in the second step, W is deposited over the pre-nucleation layer.

Importantly, in contrast with current processes, the invention forms the plug 52 before removing the hard mask 30. This provides the advantages of avoiding "residual photoresist" in the contact hole 40 in processes where the hard mask is removed before the metal deposition. See problem 1, prior art section. In addition, by filling the contact hole 40 with a plug 52 before the hard mask is removed, prevents the photoresist and contamination from the hard mask removal process (e.g., etch back or chemical-mechanical polish (CMP) from contaminating the contact hole 40 and the substrate surface 10. Using W to fill the contact hole and form the plug 52 before removing the hard mask prevents contaminating the contact holes 40 with slurry and crumbs during chemical-mechanical polish hard mask 30 removal process.

The metal layer 50 is etched back forming a plug 52 filling the contact hole 40. A metal composed of W is preferably etch using a F containing gas. The metal layer 50 is preferably composed of W.

The hard mask layer 30 is removed. The hard mask can be removed using a etch, asher (for photoresist) or chemical-mechanical polish (CMP) process. The hard mask is preferably removed using a chemical-mechanical polish process.

Second embodiment of the Invention—FIGS. 1, 2, & 6 through 9

The second embodiment of the invention forms a TiN/Ti glue layer 46 in the contact hole 40 before the W Plug 52. The second embodiment is shown in FIGS. 1, 2, and FIGS. 6 through 9.

The second embodiment begins as shown in FIGS. 1 and 2 as describe above.

FIG. 1 shows forming a dielectric layer (ILD layer 20) over a semiconductor structure 10. The semiconductor structure preferably has a doped region 14. The dielectric layer has a top surface.

A hard mask layer 30 is formed over the dielectric layer 20. The hard mask layer 30 is preferably composed of polysilicon or Silicon nitride.

A contact photoresist layer 36 having a contact photoresist opening 39 is formed over the doped region 14.

FIG. 2 shows etching the hard mask layer 30 through the contact photoresist opening 39 to form a contact hard mask opening 41 through the hard mask layer 30 exposing the dielectric layer 20.

The dielectric layer 20 is etched using the contact photoresist layer 36 and the hard mask layer 30 as an etch mask forming a contact hole 40 in the dielectric layer 20 exposing the semiconductor structure 10.

FIG. 2 shows that part of the photoresist layer 36 was etched away with only a portion of the photoresist layer 36 remaining.

Figure 6:
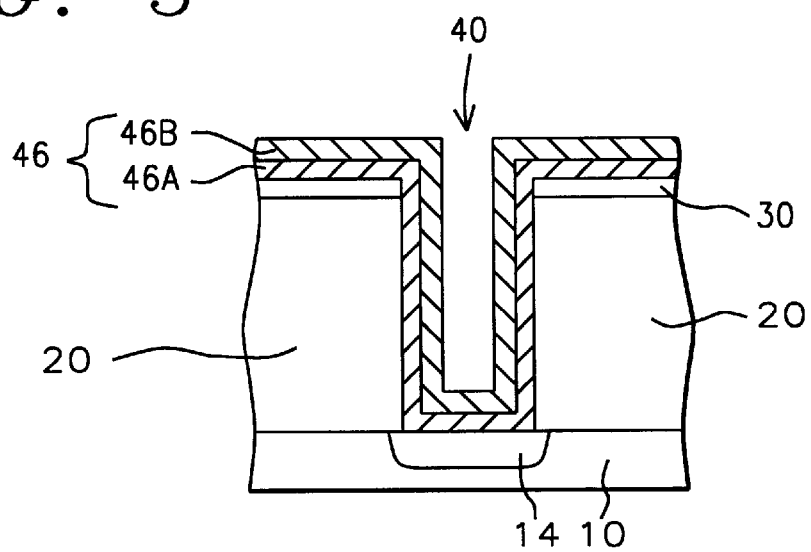

FIG. 6 shows the removal of the photoresist layer 36. The second embodiment begins as shown in FIG. 6, a glue layer 46 is formed over the dielectric layer 20. The glue layer 46 is preferably comprised of a TiN layer 46B and a Ti layer 46A.

Figure 7:
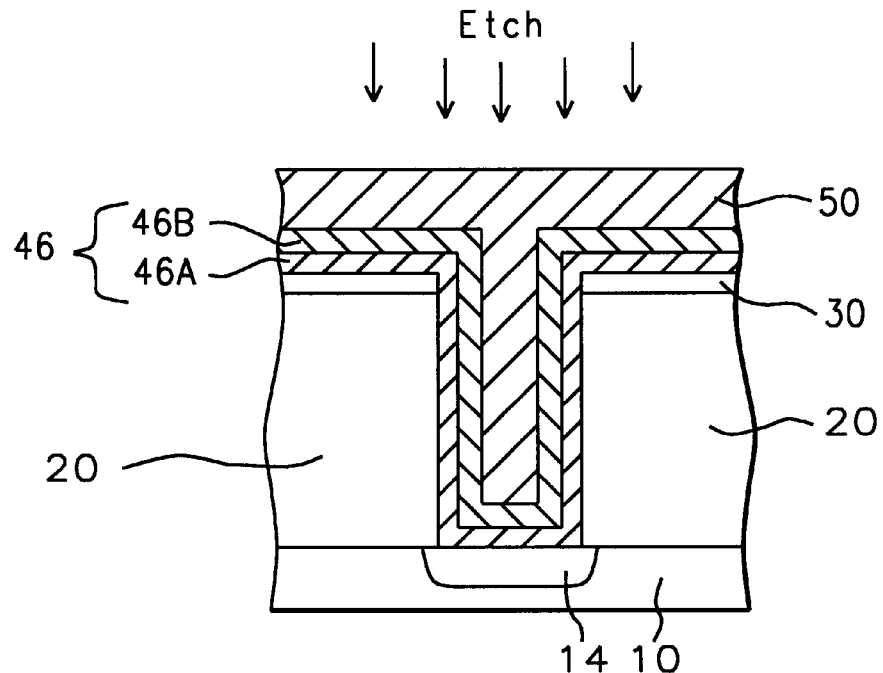

FIG. 7 shows forming a metal layer 50 over the glue layer 46 over the dielectric layer 20 and filling the contact hole 40.

Figure 8:
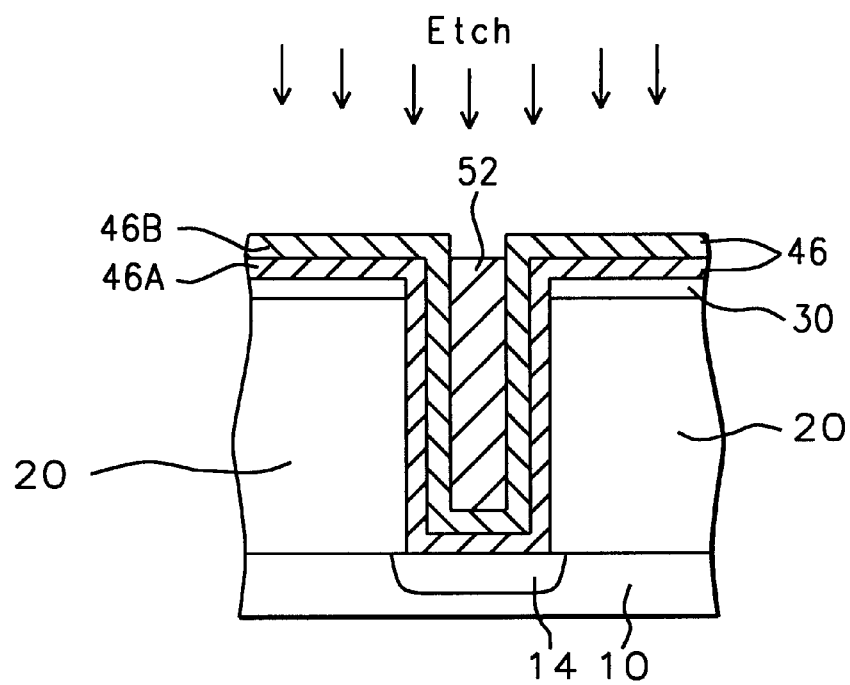

FIG. 8 shows etching back the metal layer 50 forming a plug 50 filling the contact hole 40. The etch back stops on the glue layer 16. The etch is chosen to have a high selectivity of etching the metal layer 50 faster than the glue layer. The etch back of the metal layer preferably comprises a plasma etch using a F-containing gas.

FIG. 9 shows removing the glue layer 46 over the dielectric layer 20 and removing the hard mask layer 30. The glue layer and the hard mask layer are preferably removed using plasma etch using a Cl-(chlorine) containing gas. The etch is chosen with a high selectivity to etch the glue layer faster than the dielectric layer 20 and the metal layer 50. The glue layer 46 and the hard mask layer 30 can also be removed by a chemical-mechanical polish (CMP) process. This also levels the plug top with the top surface of the dielectric layer 20. FIG. 9 shows that the plug is level or higher 53 than the dielectric layer 52 layer surface and does not contain a recess 53.

Application of the Invention to Via Holes and Interconnections Between Metal Lines Presently, the etch process to form via openings and interconnects does not require the same photo precision required for forming contacts to the substrate. However, in the future, via openings for interconnects will shrink in diameter and aspect ratios for via interconnects will increase. Presently, the invention is not required for via interconnects but the invention may be required in the future and may be implemented on via openings for metal lines. The process of the invention can be applied to form interconnects between metal layers as well as forming contacts to substrates. For example, the plug 50 in the contact hole 40 electrically contacts an underlying metal line in the semiconductor structure. That is the FIGS. 1 through 10 can represent the forming of a interconnection between two metal layers. Region 14 could represent a metal line in a dielectric layer of the semiconductor structure 10.

Advantages of the Invention

An important feature of the present invention is the removal of the Hard mask 30 after the Metal deposition 50 and etch back to form the plug 52. This late removal of the hard mask 30 prevents: problem 1—residual photoresist formation and contamination in the contact hole 40. This also prevents problem 2—recesses 120 in the plug 113. In addition the hard mask improves the etch definition of the contact hole by not eroding under the Ion bombardment from the HDP etch process.

The process of the invention provides the following benefits:

The removal of the hard mask 30 after the metal layer 50 deposition (FIGS. 3 and 5) prevent the contact hole from being contaminated from photoresist and other contamination formed during the hard mask 30 removal steps. This solves problem 1 (See prior art).

The removal of the hard mask 30 after the metal layer 50 deposition and etch back to form the plug (FIGS. 3 and 5) creates a plug 52 that does not have a recess 53. See FIG. 5—no recess in plug . Compare FIG. 10C—recess 120. This solves problem 2—Recess 120. See prior art section.

The invention's hard mask 30 prevents the excessive etching of the insulating layer 30 that occurs in prior art processes that do not have a hard mask. The HDP etch (to form the contact hole 40) is prevented from etching through the thin photoresist layer 36 and into the insulating layer 20 by the invention's hard mask 30.

It's easy to remove hard mask 30 without increasing the complexity of process integration.

The window of etch back process will be enlarged because the hard mask 30 acts as a buffer layer during this process. Without the hard mask the etch process was restricted by the thickness of photoresist 36 necessary to ensure that the insulating layer 20 was not etched.

The hard mask 30 allows the contact holes 40 to be etched more precisely and cleanly (without residual photoresist), thus reducing the contact resistance.

While the invention has been particularly shown and described with reference to the preferred embodiments thereof, it will be understood by those skilled in the art that various changes in form and details may be made without departing from the spirit and scope of the invention.

What is claimed is:

1. A method of forming a deep contact plug comprising the steps of:
   a) forming a dielectric layer over a semiconductor structure; said dielectric layer having a top surface; said semiconductor structure is a semiconductor wafer; said semiconductor structure having a doped region therein;
   b) forming a hard mask layer over said dielectric layer;
   c) said hard mask layer composed of a material selected from the group consisting of polysilicon, and silicon nitride;
   d) forming a contact photoresist layer having a contact photoresist opening over said doped region;
   e) etching said hard mask layer through said contact photoresist opening to form a contact hard mask opening through said hard mask layer exposing said dielectric layer;
   f) etching said dielectric layer using said contact photoresist layer and said hard mask layer as an etch mask forming a contact hole in said dielectric layer exposing said semiconductor structure;
   g) removing said contact photoresist layer;
   h) forming a metal layer over said hard mask layer and filling said contact hole;
   i) etching back using a plasma etch process said metal layer forming a plug filling said contact hole; and said plug having a plug top surface; said plug top surface is above said top surface of said dielectric layer; and
   j) removing said hard mask layer.

2. The method of claim 1 wherein said dielectric layer has a thickness in a range of between 8000 and 25,000 Å.

3. The method of claim 1 wherein said hard mask having a thickness in a range of between 500 and 5000 Å.

4. The method of claim 1 wherein the etching of said dielectric layer to form said contact hole comprises a high density plasma (HDP) etch process.

5. The method of claim 1 wherein said metal layer is comprised of tungsten.

6. The method of claim 1 wherein said plug in said contact hole electrically contacts an underlying metal line in said semiconductor structure.

7. A method of forming a contact plug in a high aspect contact hole comprising the steps of:
   a) forming a dielectric layer over a semiconductor structure; said semiconductor structure is a semiconductor wafer; said semiconductor structure having a doped region; said doped region comprises a source or drain region; said dielectric layer having a top surface;
   b) forming a hard mask layer over said dielectric layer; said hard mask layer composed of a material selected from the group consisting of polysilicon and silicon nitride;
   c) forming a contact photoresist layer having a contact photoresist opening over said hard mask layer;

d) etching said hard mask layer through said contact photoresist opening to form a contact hard mask opening through said hard mask layer exposing said dielectric layer;

e) etching said dielectric layer using said contact photoresist layer and said hard mask layer as an etch mask forming a contact hole in said dielectric layer exposing said semiconductor structure;

f) removing said contact photoresist layer;

g) forming a metal layer filling said contact hole and over said hard mask layer; said metal layer is comprised of tungsten;

h) etching back using a plasma etch process said metal layer forming a plug filling said contact hole; and said plug having a plug top surface; said plug top surface is above said top surface of said dielectric layer;

i) removing said hard mask layer.

8. The method of claim 7 wherein said dielectric layer is etched using a high density plasma (HDP) etch process.

9. A method of forming a deep contact plug comprising the steps of:

a) forming a dielectric layer over a semiconductor structure; said semiconductor structure having a doped region; said dielectric layer having a top surface;

b) forming a hard mask layer over said dielectric layer; said hard mask layer composed of a material selected from the group consisting of polysilicon and silicon nitride;

c) forming a contact photoresist layer having a contact photoresist opening over said doped region;

d) etching said hard mask layer through said contact photoresist opening to form a contact hard mask opening through said hard mask layer exposing said dielectric layer;

e) etching said dielectric layer using said contact photoresist layer and said hard mask layer as an etch mask forming a contact hole in said dielectric layer exposing said semiconductor structure;

f) removing said contact photoresist layer;

g) forming a glue layer over said hard mask layer;

h) forming a metal layer over said glue layer and filling said contact hole; said metal layer is comprised of Tungsten;

i) etching back using a plasma etch process said metal layer forming a plug filling said contact hole; the etch back stopping on said glue layer; the etch etches the metal layer faster than said glue layer; and j) etching said glue layer over said hard mask layer with a plasma etch using a chlorine containing gas that etches the glue layer faster than said with dielectric layer and removing said hard mask layer.

10. The method of claim 9 wherein said dielectric layer having a thickness in a range of between 8000 and 25,000 Å.

11. The method of claim 9 wherein the etching of said dielectric layer to form said contact hole comprises a high density plasma (HDP) etch process.

12. The method of claim 9 wherein said glue layer is comprised of a TiN layer and a Ti layer.

13. The method of claim 9 wherein the etch back of said metal layer comprises a plasma etch using a F-containing gas.

14. The method of claim 9 wherein said glue layer and said hard mask layer are removed using plasma etch using a Cl containing gas.

15. The method of claim 9 wherein said glue layer and said hard mask layer are removed by a chemical-mechanical polish (CMP) process.

* * * * *